US009281057B1

(12) United States Patent
Herr et al.

(10) Patent No.: US 9,281,057 B1
(45) Date of Patent: Mar. 8, 2016

(54) PHASE HYSTERETIC MAGNETIC JOSEPHSON JUNCTION MEMORY CELL

(71) Applicants: Anna Y. Herr, Ellicott City, MD (US); Quentin P. Herr, Ellicott City, MD (US); Andrew Hostetler Miklich, Columbia, MD (US)

(72) Inventors: Anna Y. Herr, Ellicott City, MD (US); Quentin P. Herr, Ellicott City, MD (US); Andrew Hostetler Miklich, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/645,103

(22) Filed: Mar. 11, 2015

(51) Int. Cl.
G11C 11/44 (2006.01)

(52) U.S. Cl.
CPC .................................. *G11C 11/44* (2013.01)

(58) Field of Classification Search
CPC ................................ G11C 11/44; G11C 11/00
USPC ............ 365/106, 129–173, 200; 257/13, 202, 257/97, E29.071, E29.168, E49.003, 257/31–36, 661–663, E39.001–E39.006, 257/E39.012–E39.016; 438/73, 962; 977/708, 773, 774, 933
See application file for complete search history.

(56) References Cited

U.S. PATENT DOCUMENTS

| 5,114,912 | A | * | 5/1992 | Benz | ....................... H01L 27/18 257/32 |
| 5,309,038 | A | * | 5/1994 | Harada | ................. H03K 23/763 327/186 |
| 8,208,288 | B2 | | 6/2012 | Bulzacchelli et al. | |
| 8,270,209 | B2 | | 9/2012 | Herr et al. | |
| 8,547,732 | B2 | | 10/2013 | Bulzacchelli et al. | |
| 8,670,807 | B2 | | 3/2014 | Rose et al. | |
| 8,971,977 | B2 | | 3/2015 | Mukhanov et al. | |
| 2015/0043273 | A1 | | 2/2015 | Naaman et al. | |

OTHER PUBLICATIONS

Herr, et al. :*"Phase Hysteretic Magnetic Josephson Junction Memory Cell"*, U.S. Appl. No. 14/043,360, filed Oct. 1, 2013, (not yet published).

* cited by examiner

*Primary Examiner* — Harry W Byrne
(74) *Attorney, Agent, or Firm* — Tarolli, Sundheim, Covell & Tummio LLP

(57) ABSTRACT

One embodiment describes a memory cell. The memory cell includes a phase hysteretic magnetic Josephson junction (PH-MJJ) that is configured to store one of a first binary logic state corresponding to a binary logic-1 state and a second binary logic state corresponding to a binary logic-0 state in response to a write current that is provided to the memory cell and to generate a superconducting phase based on the stored digital state. The memory cell also includes a superconducting read-select device that is configured to implement a read operation in response to a read current that is provided to the memory cell. The memory cell further includes at least one Josephson junction configured to provide an output based on the superconducting phase of the PHMJJ during the read operation, the output corresponding to the stored digital state.

20 Claims, 5 Drawing Sheets

PHASE HYSTERETIC MAGNETIC JOSEPHSON JUNCTION MEMORY CELL

TECHNICAL FIELD

The present invention relates generally to quantum and classical digital superconducting circuits, and specifically to a phase hysteretic magnetic Josephson junction memory cell.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is performed with Josephson devices. However, such a configuration yields only nominally higher performance than standard CMOS and suffers from relatively high power dissipation for a cryogenic environment.

SUMMARY

One embodiment describes a memory cell. The memory cell includes a phase hysteretic magnetic Josephson junction (PHMJJ) that is configured to store one of a first binary logic state corresponding to a binary logic-1 state and a second binary logic state corresponding to a binary logic-0 state in response to a write current that is provided to the memory cell and to generate a superconducting phase based on the stored digital state. The memory cell also includes a superconducting read-select device that is configured to implement a read operation in response to a read current that is provided to the memory cell. The memory cell further includes at least one Josephson junction configured to provide an output based on the superconducting phase of the PHMJJ during the read operation, the output corresponding to the stored digital state.

Another example embodiment includes a method for reading a memory cell in a JMRAM system. The method includes providing a first read current to the memory cell to select the memory cell for a read operation via a superconducting read-select device. The memory cell includes a phase hysteretic magnetic Josephson junction (PHMJJ) that is configured to store a digital state corresponding to one of a binary logic-1 state and a binary logic-0 state based on a superconducting phase. The method also includes providing a second read current to bias to at least one Josephson junction. The method further includes measuring an amplitude of a voltage that is generated during the read operation via the first and second read currents. The amplitude of the voltage can correspond to the stored digital state based on a magnitude of the superconducting phase.

Another example embodiment includes a Josephson magnetic random access memory (JMRAM) system. The system includes a plurality of word-write lines each configured to conduct a respective word-write current that selects a given row of memory cells during a data write operation. The memory cells each include a magnetic-barrier Josephson junction (MBJJ), a phase hysteretic magnetic Josephson junction (PHMJJ), and at least one Josephson junction. The system also includes a plurality of bit-write lines each configured to conduct a respective bit-write current to write a digital state corresponding to one of a binary logic-0 state and a binary logic-1 state into the PHMJJ associated with each memory cell of the given row of memory cells. The PHMJJ can be magnetically coupled to a respective one of the plurality of word-write lines and a respective one of the plurality of bit-write lines. The system also includes a plurality of word-read lines each configured to conduct a respective word-read current that is provided to the MBJJ of each of the memory cells in the given row to select the given row of memory cells during a read operation. The system further includes a plurality of bit-read lines each configured to conduct a respective bit-read current to bias the at least one Josephson junction of each of the memory cells in a given column. The MBJJ in a respective memory cell switches from a zero-state to a π-state in response to the word-read current to provide an indication of the stored digital state during the read operation via the biased at least one Josephson junction in response to the π-state and a superconducting phase provided by the PHMJJ.

DETAILED DESCRIPTION

The present invention relates generally to quantum and classical digital superconducting circuits, and specifically to a phase hysteretic magnetic Josephson junction memory cell. The JMRAM system can implement an array of memory cells that each includes a phase hysteretic magnetic Josephson junction (PHMJJ) that can be configured as including ferromagnetic materials in an associated barrier. The memory cells can also each include at least one Josephson junction (e.g., a pair of Josephson junctions in series with the PHMJJ). The PHMJJ can be configured to store a digital state corresponding to one of a binary logic-1 state or a binary logic-0 state in response to a word-write current and a bit-write current associated with the PHMJJ. As an example, the word-write and bit-write currents can each be provided on dedicated word-write and bit-write lines, and can set the logic state of the PHMJJ based on the bit-write current provided on the bit-write line.

In addition, the PHMJJ of each of the memory cells of the array can provide an indication of the stored digital state in response to a word-read current and a bit-read current. As an example, the PHMJJ can be configured as a switchable π-junction that is configured to generate a superconducting phase having a magnitude based on the digital state stored therein. As an example, the superconducting phase can have a first magnitude corresponding to a first stored digital state, and can have a second magnitude (e.g., zero magnitude) corresponding to a second stored digital state. The superconducting phase can thus lower a critical current associated with the at least one Josephson junction of each of the memory cells of a row of the array. Therefore, the word-read current and the bit-read current can be provided to either trigger or not trigger the Josephson junction(s) to generate a voltage having an amplitude corresponding to the stored digital state. As an example, the bit-read current can provide a bias with respect to the Josephson junction(s), and the word-read current can be provided to a superconducting read-select device. For example, the superconducting read-select device can be configured as a magnetic barrier Josephson junction (MBJJ) that can switch from a zero-state to a π-state in response to the word-read current, thus enabling a triggering of the Josephson junction(s) in one of the stored digital states, and not triggering the Josephson junction(s) in the other of the stored digital states. Thus, the bit-read line can have a voltage having a magnitude that varies based on whether the digital state of the PHMJJ corresponds to the binary logic-1 state or the binary logic-0 state. As described herein, the term "trigger" with respect to Josephson junctions describes the phenomenon of the Josephson junction generating a discrete voltage pulse in response to a current flow through the Josephson junction exceeding a critical current.

Figure 1:
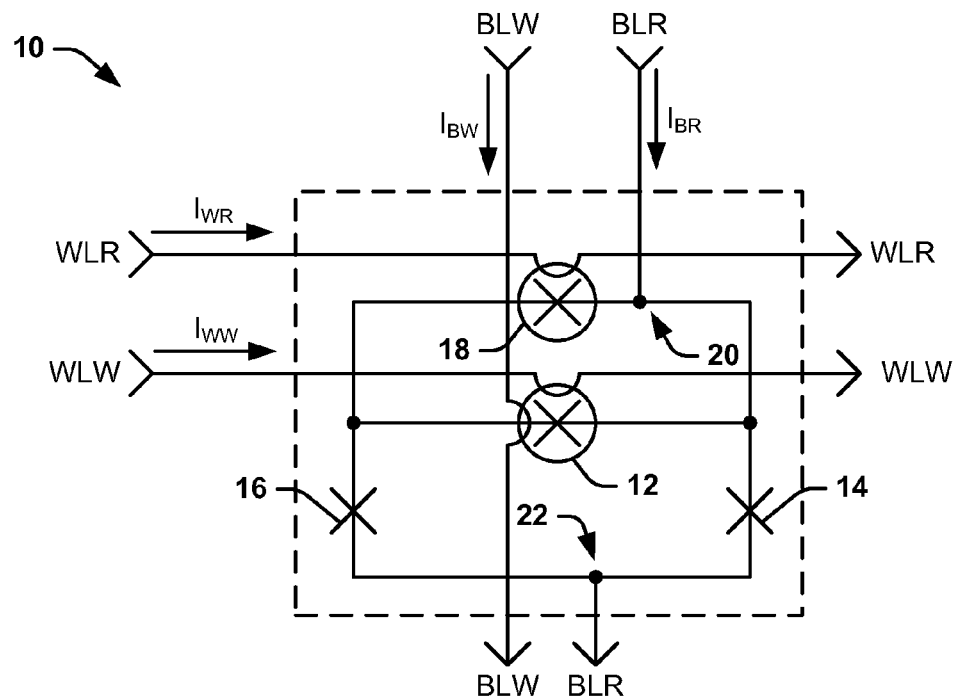
FIG. 1 illustrates an example of a memory cell.

FIG. 1 illustrates an example of a memory cell 10 in accordance with an aspect of the invention. As an example, the memory cell 10 can correspond to one of a plurality of memory cells that are arranged in an array as rows and columns, as described in greater detail herein.

The memory cell 10 includes a first write line WLW and a first read line WLR that each pass through the memory cell 10. The first write line WLW conducts a first write current $I_{WW}$ during a data write operation and the first read line WLR conducts a first read current $I_{WR}$ during a data read operation. As an example, the first write current $I_{WW}$ can correspond to a word-write current associated with a row of memory cells in an array, and the first read current $I_{WR}$ can correspond to a word-read current associated with the row of memory cells in the array. For example, the first write and first read lines WLW and WLR can likewise be coupled to adjacent memory cells in a given row on either side of the memory cell 10. Thus, the first read and first write currents $I_{WW}$ and $I_{WR}$ flow through all of the memory cell systems in the row, including the memory cell 10, during the respective data write and data read operations. Similarly, the memory cell 10 includes a second write line BLW and a second read line BLR that each pass through the memory cell 10. The second write line BLW conducts a second write current $I_{BW}$ during the data write operation and the second read line BLR conducts a second read current $I_{BR}$ during the data read operation. As an example, the second write current $I_{BW}$ can correspond to a bit-write current associated with a column of memory cells in the array, and the first read current $I_{BR}$ can correspond to a bit-read current associated with the column of memory cells in the array. In a similar manner, the second write and second read lines BLW and BLR can likewise be coupled to adjacent memory cells in a given column above and below the memory cell 10. Thus, the second read and second write currents $I_{BR}$ and $I_{BW}$, respectively, flow through all of the memory cell systems in the column, including the memory cell 10, during the respective data write and data read operations. As an example, the second read current $I_{BR}$ provided on the second read line BLR can be provided as a DC bias current.

The memory cell 10 also includes a phase hysteretic magnetic Josephson junction (PHMJJ) 12 that is configured to store a digital state corresponding to one of the binary logic-1 state or the binary logic-0 state. As an example, the PHMJJ 12 can include ferromagnetic materials in associated barriers to be configured as a switchable π-junction. The memory cell 10 also includes a first Josephson junction 14 and a second Josephson junction 16 that are arranged in series with the PHMJJ 12. As an example, the Josephson junctions 14 and 16 can be configured as superconductor-insulator-superconductor Josephson junctions. The PHMJJ 12 can include outer layers of superconducting material, such as Niobium (Nb), and one or more internal thin film layers of ferromagnetic materials. As an example, the thin film layers of ferromagnetic materials can include one or more "hard" ferromagnetic layers having a substantially fixed magnetic field and one or more "soft" ferromagnetic layers that can be changed as a result of magnetic fields generated locally by orthogonal electrical currents. Furthermore, the PHMJJ 12 can include one or more additional layers, such as oxide layers, that are interleaved with the superconducting and/or ferromagnetic layers.

In the example of FIG. 1, the first write line WLW and the second write line BLW are demonstrated as magnetically coupled to the PHMJJ 12, as indicated at 16. As an example, the PHMJJ 12 can include two or more different ferromagnetic layers, and the orientation of the magnetic field in one of the ferromagnetic layers is substantially fixed. The magnetic field orientation of the other one or more ferromagnetic layers can be changed as a result of magnetic fields that are generated locally by the first write current $I_{WW}$ and the second write current $I_{BW}$.

Therefore, based on the configuration of the PHMJJ 12, the first write current $I_{WW}$ and the second write current $I_{Bw}$ can generate the magnetic field to set the digital state of the PHMJJ 12 to a binary logic-1 state or a binary logic-0 state using magnetic states of the PHMJJ 12 based on the respective directions of current flow during a data write operation. As one example, if the combined magnetic field produced by the first write current $I_{WW}$ and the second write current $I_{BW}$ has the same orientation as the internal magnetic field of the hard ferromagnetic layers, the individual magnetic fields of each of the first write current $I_{WW}$ and the second write current $I_{BW}$ can add together positively or negatively to set the digital state of the phase hysteretic magnetic Josephson junction to correspond to a binary logic-1 state or a binary logic-0 state respectively. However, if the combined magnetic field produced by the first write current $I_{WW}$ and the second write current $I_{BW}$ has the opposite orientation as the internal magnetic field of the hard ferromagnetic layers, the digital state of the PHMJJ 12 remains unchanged. As another example, the first write current $I_{WW}$ and the second write current $I_{BW}$ can be applied as a sequence of write current pulses, such that if the first write current pulse $I_{WW}$ overlaps in time with the second write current pulse $I_{BW}$, the digital state of the PHMJJ 12 can correspond to a binary logic-1 state or a binary logic-0 state. However, if only one such pulse is present at a given time, or if the first and the second write current pulses $I_{WW}$ and $I_{BW}$ do not sufficiently overlap in time, the digital state of the PHMJJ 12 can remain unchanged.

Similarly, the individual magnetic field of only one of the first write current $I_{WW}$ and the second write current $I_{BW}$ may be insufficient to change the digital state of the PHMJJ 12, such that memory cells in unaddressed rows maintain their respective digital states despite the flow of the second write current $I_{BW}$. Furthermore, based on the superconductivity of the first write line WLW and the second write line BLW and the presence of a superconducting ground plane, cross-coupling between the write lines WLW and BLW and write lines associated with other memory cells in an associated memory system can be substantially mitigated. Therefore, for a given current-flow direction of the first write current $I_{WW}$ in a given row, the current-flow directions of the respective second write currents $I_{BW}$ in each of the columns can be controlled to set the digital state of each of the PHMJJs 12 in a given row during a data write operation without affecting the digital states in any of the memory cells in any of the other rows through which a first write current $I_{WW}$ is not provided.

The memory cell 10 also includes a superconducting read-select device 18, demonstrated in the example of FIG. 1 as a magnetic barrier Josephson junction (MBJJ). As an example, the MBJJ 18 can be configured substantially similar to the PHMJJ 12, but may be fabricated with or without hysteretic characteristics. The MBJJ 18 is demonstrated as being arranged in parallel with the PHMJJ 12, is conductively coupled with the second read line BLR, and is inductively coupled with the first read line WLR. The second read line BLR is coupled to a node 20 that interconnects the PHMJJ 12 and the MBJJ 18, such that the second read current $I_{BR}$ enters the memory cell 10 at the node 20, and is coupled to a node 22 corresponding to an output of the memory cell 10 between the Josephson junctions 14 and 16, such that the second read current $I_{BR}$ exits the memory cell 10 from the node 22.

The digital state of the PHMJJ 12 can be read from the memory cell 10 during a read operation in response to the first read current $I_{WR}$ and the second read current $I_{BR}$. Specifically, the first read current $I_{WR}$ can be provided on the first read line WLR to select the row of memory cells in the associated memory array. Based on the inductive coupling of the first read line WLR with the MBJJ 18, the first read current $I_{WR}$ is provided as a DC current pulse that is inductively provided to the MBJJ 18. The first read current $I_{WR}$ can thus switch the MBJJ 18 from a zero-state to a π-state during the read operation. The second read current $I_{BR}$ is provided to the node 20 to provide a bias for the Josephson junctions 14 and 16. Therefore, a superconducting phase (e.g., one half of a flux quantum) resulting from the π-state of the MBJJ 18, as resulting from the first read current $I_{WR}$, is added to a superconducting phase of the PHMJJ 12 (e.g., one half of a flux quantum), which can trigger the Josephson junctions 14 and 16 based on the effect of the superconducting phases on the critical threshold of the Josephson junctions 14 and 16 and based on the bias provided by the second read current $I_{BR}$. The stored binary digital state of the PHMJJ 12 can be determined by an amplitude of a voltage on the second read line BLR based on a magnitude of the superconducting phase that can be provided by the PHMJJ 12. As described herein, the term "superconducting phase" corresponds to a spontaneous supercurrent circulating in a first loop through the MBJJ 18 and the Josephson junctions 14 and 16 in response to the MBJJ 18 being in the π-state, and in a second loop through the PHMJJ 12 and the first and second Josephson junctions 14 and 16 in response to the PHMJJ 12 being in the π-state, with the supercurrent having a magnitude based on an internal superconductor flux quantum divided by an inductance term.

As an example, the memory cell 10 can be designed such that the π-state of the MBJJ 18 can have the same polarity of the π-state of the PHMJJ 12, which can be set during the write operation described herein as corresponding to the stored digital state. Therefore, the superconducting phases of the MBJJ 18 and the PHMJJ 12 can be substantially consistently additive during the read operation in a first stored logic state (e.g., in a stored logic-1 state). For example, if the PHMJJ 12 stores a logic-1 binary state, the PHMJJ 12 has a first superconducting phase magnitude (e.g., a positive superconducting phase) having the same polarity as the superconducting phase of the MBJJ 18 in the π-state. Therefore, the combined superconducting phases of the respective π-states of the PHMJJ 12 and the MBJJ 18, added to the bias of the second read current $I_{BR}$, is sufficient to trigger the Josephson junctions 14 and 16. Accordingly, the Josephson junctions 14 and 16 can trigger in an oscillatory manner to increase the voltage on the second read line BLR to indicate the logic-1 state. However, as another example, if the PHMJJ 12 stores a logic-0 binary state, the PHMJJ 12 has a second superconducting phase magnitude, which can be zero superconducting phase. Therefore, the superconducting phase of the π-state of the MBJJ 18 and the bias provided by the second read current $I_{BR}$ can be insufficient to trigger the Josephson junctions 14 and 16 absent the superconducting phase of the π-state of the PHMJJ 12. Accordingly, a voltage on the second read line BLR can remain at a substantially decreased amplitude (e.g., zero volts) to indicate the logic-0 state.

Figure 2:
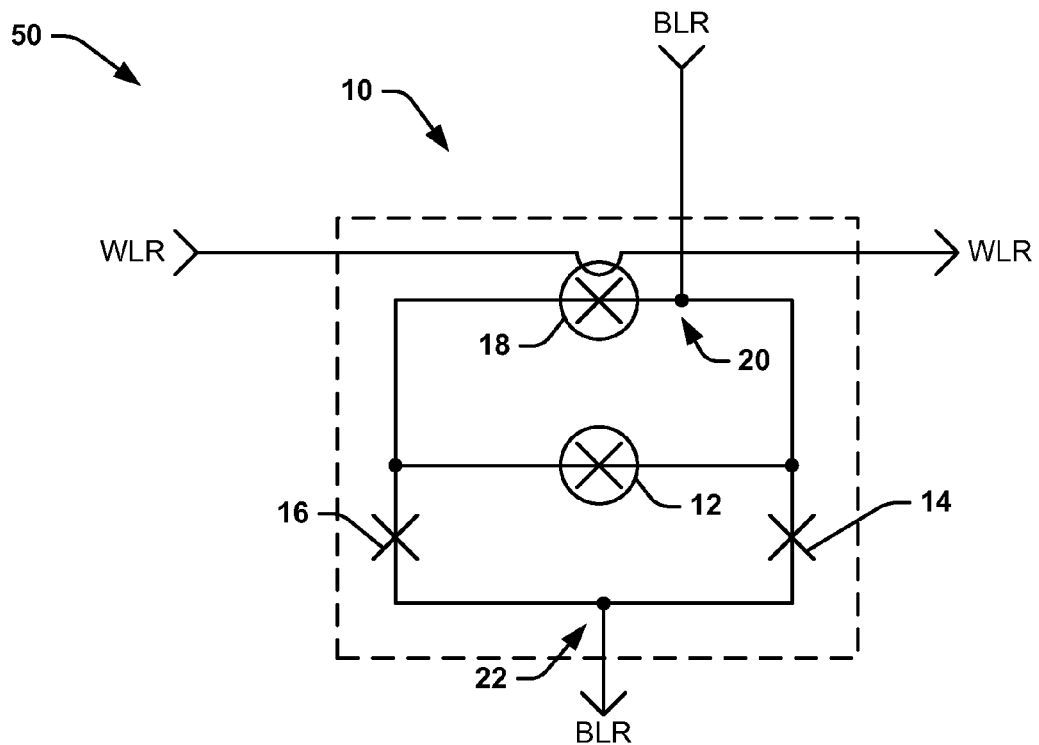
FIG. 2 illustrates an example of a memory cell in a first memory state.

FIG. 2 illustrates an example of a diagram 50 of the memory cell 10 in a first memory state. The memory cell 10 is demonstrated in the example of FIG. 2 as excluding the second write line BLW and the first write line WLW for simplicity. As an example, the PHMJJ 12 can store a logic-0 binary state in the example of FIG. 2. For example, the memory cell 10 can have been provided the first and second write currents $I_{WW}$ and $I_{BW}$ during a prior provided write operation to magnetically store the logic-0 binary state in the PHMJJ 12, as described previously. As a result, in the example of FIG. 2, the PHMJJ 12 provides a magnitude zero superconducting phase (i.e., no superconducting phase). The memory cell 10 is demonstrated in the diagram 50 as in a storage condition, such as prior to a read operation. As such, no read currents are demonstrated as flowing through the first read line WLR and the second read line BLR. Because the first read current $I_{WR}$ is not provided in the diagram 50, the MBJJ 18 is demonstrated in the zero-state, and thus does not provide a superconducting phase.

Figure 3:
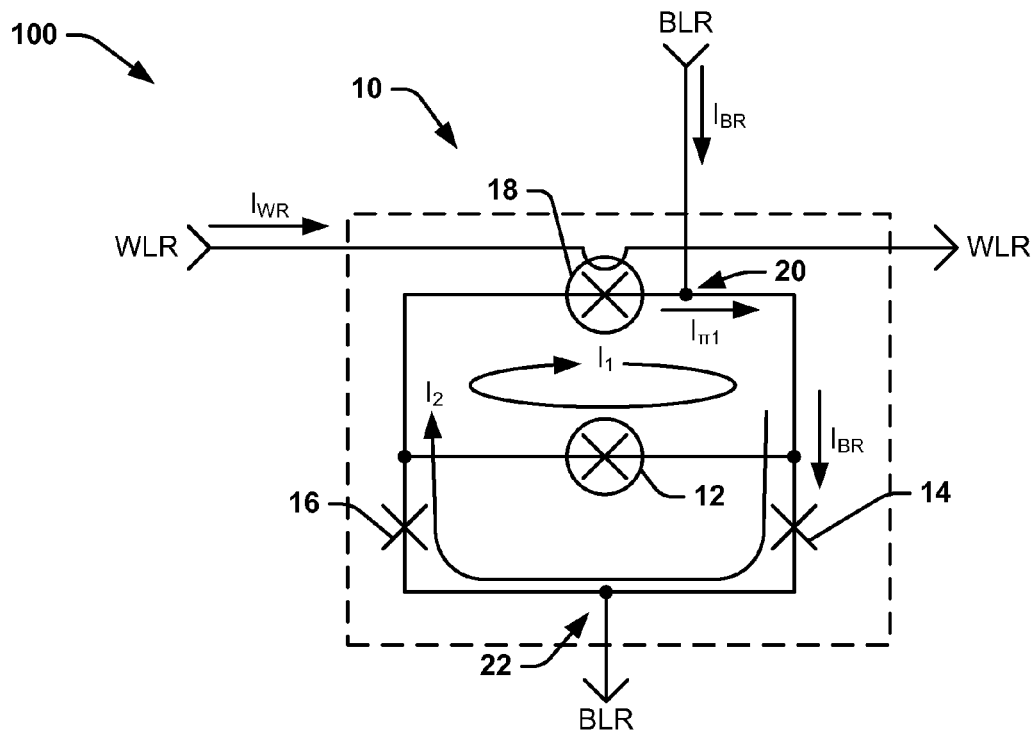
FIG. 3. illustrates an example of a diagram of readout of a memory cell.

FIG. 3 illustrates an example of a diagram 100 of readout of the memory cell 10. In the example of FIG. 3, the memory cell 10 is demonstrated during a read operation. Thus, the first read current $I_{WR}$ flows on the first read line WLR (e.g., as a DC current pulse), and is thus inductively provided to the MBJJ 18. As a result, the MBJJ 18 switches from a zero-state to the π-state, and therefore provides a superconducting phase demonstrated as a current $I_{\pi 1}$ flowing from the MBJJ 18.

Additionally, in the example of FIG. 3, the second read current $I_{BR}$ is provided to the memory cell 10 at the node 20 between the MBJJ 18 and the PHMJJ 12. Therefore, the current $I_{\pi 1}$ is added to second read current $I_{BR}$. In the example of FIG. 3, the current $I_{\pi 1}$ and the second read current $I_{BR}$ are combined to provide a first current loop $I_1$ that flows through the PHMJJ 12 and the MBJJ 18 and a second current loop $I_2$ that flows through the Josephson junctions 14 and 16 and the MBJJ 18. Because the PHMJJ 12 does not provide any superconducting phase, a portion of both the current $I_{\pi 1}$ and the second read current $I_{BR}$ flows through the PHMJJ 12 (i.e., the current loop $I_1$ in the example of FIG. 3). Therefore, this portion of both the current $I_{\pi 1}$ and the second read current $I_{BR}$ that flows through the PHMJJ 12 is diverted away from flowing through the Josephson junctions 14 and 16, leaving only the portion of the current loop $I_2$ as a sense current flowing through the Josephson junctions 14 and 16. The current loop $I_2$ can thus have a magnitude that is less than the critical current of the Josephson junctions 14 and 16, and is thus insufficient to trigger the Josephson junctions 14 and 16. Accordingly, a voltage that is measured on the second read line BLR maintains a substantially lesser magnitude (e.g., zero volts) to indicate the logic-0 binary state that is stored in the PHMJJ 12.

It is to be understood that the current direction of the current $I_{\pi 1}$ is not limited to as demonstrated in the example of FIG. 3. As an example, in response to the MBJJ 18 switching to the π-state, the superconducting phase associated with the current $I_{\pi 1}$ can instead be provided in the opposite direction. However, the second read current $I_{BR}$ can flow substantially equally in parallel through the Josephson junctions 14 and 16 from the node 20 to the node 22. Therefore, the current directions of the currents $I_1$ and $I_2$ can be switched based on the direction of the superconducting phase associated with the current $I_{\pi 1}$.

Figure 4:
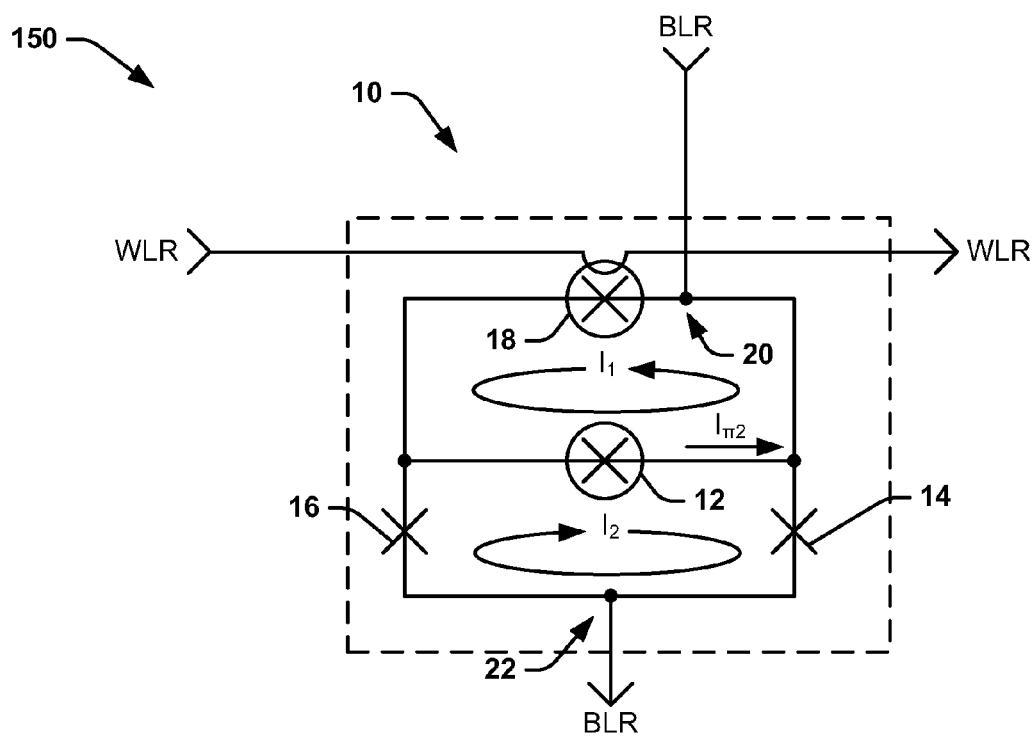
FIG. 4 illustrates an example of a memory cell in a second memory state.

FIG. 4 illustrates an example of a diagram 150 of the memory cell 10 in a second memory state. Similar to as described previously in the example of FIG. 2, the memory cell 10 is demonstrated in the example of FIG. 4 as excluding the second write line BLW and the first write line WLW for simplicity. As an example, the PHMJJ 12 can store a logic-1 binary state in the example of FIG. 4. For example, the memory cell 10 can have been provided the first and second write currents $I_{WW}$ and $I_{BW}$ during a prior provided write operation to magnetically store the logic-1 binary state in the PHMJJ 12, as described previously. As a result, in the example of FIG. 4, the PHMJJ 12 provides a superconducting phase in a second magnitude (e.g., a non-zero magnitude), demonstrated as a current $I_{\pi 2}$ flowing from the PHMJJ 12. The current $I_{\pi 2}$ thus flows in the first loop through the PHMJJ 12 and the MBJJ 18 as a current loop $I_1$ in a counter-clockwise direction and in the second loop through the PHMJJ 12 and the Josephson junctions 14 and 16 as a current loop $I_2$ in a clockwise direction. The memory cell 10 is demonstrated in the diagram 150 as in a storage condition, such as prior to a read operation. As such, no read currents are demonstrated as flowing through the first read line WLR and the second read line BLR. Because the first read current $I_{WR}$ is not provided in the diagram 150, the MBJJ 18 is demonstrated in the zero-state, and thus does not provide a superconducting phase.

Figure 5:
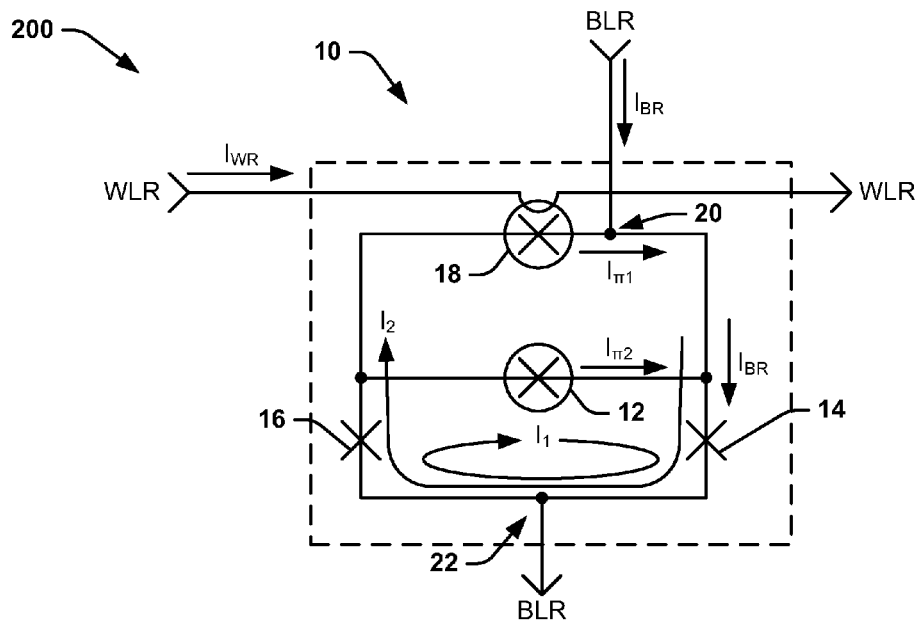
FIG. 5 illustrates another example of a diagram of readout of a memory cell.

FIG. 5 illustrates another example of a diagram 200 of readout of the memory cell 10. In the example of FIG. 5, the memory cell 10 is demonstrated during a read operation. Thus, the first read current $I_{WR}$ flows on the first read line WLR (e.g., as a DC current pulse), and is thus inductively provided to the MBJJ 18. As a result, the MBJJ 18 switches from a zero-state to the π-state, and therefore provides a superconducting phase demonstrated as a current $I_{\pi 1}$ flowing from the MBJJ 18. As described previously, the memory cell 10 can be designed such that the superconducting phase of the MBJJ 18 can have the same polarity as the superconducting phase of the PHMJJ 12. Therefore, the current $I_{\pi 1}$ is demonstrated in the example of FIG. 5 as flowing in the same direction from the MBJJ 18 as the current $I_{\pi 2}$ flowing from the PHMJJ 12. As a result, the superconducting phases of the PHMJJ 12 and the MBJJ 18 combine, such that the currents $I_{\pi 1}$ and $I_{\pi 2}$ combine. In the example of FIG. 5, the current loop $I_1$ thus corresponds to the current $I_{\pi 2}$, and the current loop $I_2$ thus corresponds to the current $I_{\pi 1}$, such that the current loop $I_2$ flows through the loop of the MBJJ 18 and the Josephson junctions 14 and 16 and the current loop $I_1$ flows through the loop of the PHMJJ 12 and the Josephson junctions 14 and 16.

Additionally, in the example of FIG. 5, the second read current $I_{BR}$ is provided to the memory cell 10 at the node 20 between the MBJJ 18 and the PHMJJ 12. Because the superconducting phase of the PHMJJ 12 has the second magnitude and is combined with the superconducting phase of the MBJJ 18, the combined amplitude of the current loops $I_1$ and $I_2$ is added to the second read current $I_{BR}$. In other words, the combined amplitude of the current loops $I_1$ and $I_2$ act to decrease the critical current of the Josephson junction 14 with respect to the second read current $I_{BR}$. The resulting combined current amplitude can have a magnitude that is greater than the critical current of the Josephson junction 14, and is thus sufficient to trigger the Josephson junction 14. In response, the Josephson junction 14 can trigger to generate a voltage pulse on the second read line BLR. The triggering of the Josephson junction 14 can thus cause the Josephson junction 16 to trigger, which can thus continue to provide sequential triggering between the Josephson junctions 14 and 16 in an oscillatory manner to substantially maintain the voltage pulses on the second read line BLR. Accordingly, the substantially increased voltage provided by the voltage pulses on the second read line BLR can indicate the logic-1 binary state that is stored in the PHMJJ 12.

Similar to as described previously, it is to be understood that the current directions of the currents $I_{\pi 1}$ and $I_{\pi 2}$ and the second read current $I_{BR}$ are not limited to as demonstrated in the example of FIGS. 4 and 5. As an example, the superconducting phase associated with the current $L_{E2}$ can instead be provided in the opposite direction in the example of FIG. 4. However, as described previously, the memory cell 10 can be designed such that the superconducting phase of the MBJJ 18 can have the same polarity as the superconducting phase of the PHMJJ 12. Thus, in response to the MBJJ 18 switching to the π-state, the superconducting phase associated with the current $I_{\pi 1}$ can likewise be provided in the opposite direction to still combine with the current $I_{\pi 2}$. Additionally, as described previously, the second read current $I_{BR}$ can flow substantially equally in parallel through the Josephson junctions 14 and 16 from the node 20 to the node 22. Therefore, the current directions of the currents $I_1$ and $I_2$ can be switched based on the direction of the superconducting phase associated with the currents $I_{\pi 1}$ and $I_{\pi 2}$. Thus, the resulting combined current amplitude can have a magnitude that is greater than the critical current of the Josephson junction 16, and is thus sufficient to trigger the Josephson junction 16 to provide the sequential triggering of the Josephson junctions 14 and 16 in an oscillatory manner to indicate the logic-1 binary state that is stored in the PHMJJ 12.

It is to be understood that the memory cell 10 is not intended to be limited to the example of FIGS. 1 through 5. As an example, the memory cell 10 is demonstrated diagrammatically, such that the arrangement of the first lines WLR and WLW and the second lines BLR and BLW with respect to each other and to the PHMJJ 12 can vary. For example, the configuration of the first write line WLW and the second write line BLW can be such that the direction of current flow of the first write current $I_{WW}$ and the second write current $I_{BW}$ can be opposite to store the digital state in the PHMJJ 12. In addition, the memory cell 10 is not limited to implementing a pair of Josephson junctions 14 and 16 in series with the PHMJJ 12, but could instead implement additional Josephson junctions or a single Josephson junction or could be configured as a variety of other arrangements. Additionally, the superconducting read-select device is not limited to being configured as the MBJJ 18, but could instead be configured as a different device to combine with the superconducting phase of the PHMJJ 12 or to be subtracted from the superconducting phase of the PHMJJ 12 during a read operation to trigger or not trigger the Josephson junctions 14 and 16 based on the stored digital state. As another example, while the first read line WLR is demonstrated as inductively coupled to the MBJJ 18, it is to be understood that other ways of switching the MBJJ 18 from the zero-state to the π-state can be implemented (e.g., a capacitive coupling). Additionally, the MBJJ 18 can be configured with a hysteretic capability, such that the first read current $I_{WR}$ can be provided during the read operation as a positive pulse first, followed by a negative pulse to reset the MBJJ 18. Accordingly, the memory cell 10 can be configured in a variety of ways.

Figure 6:
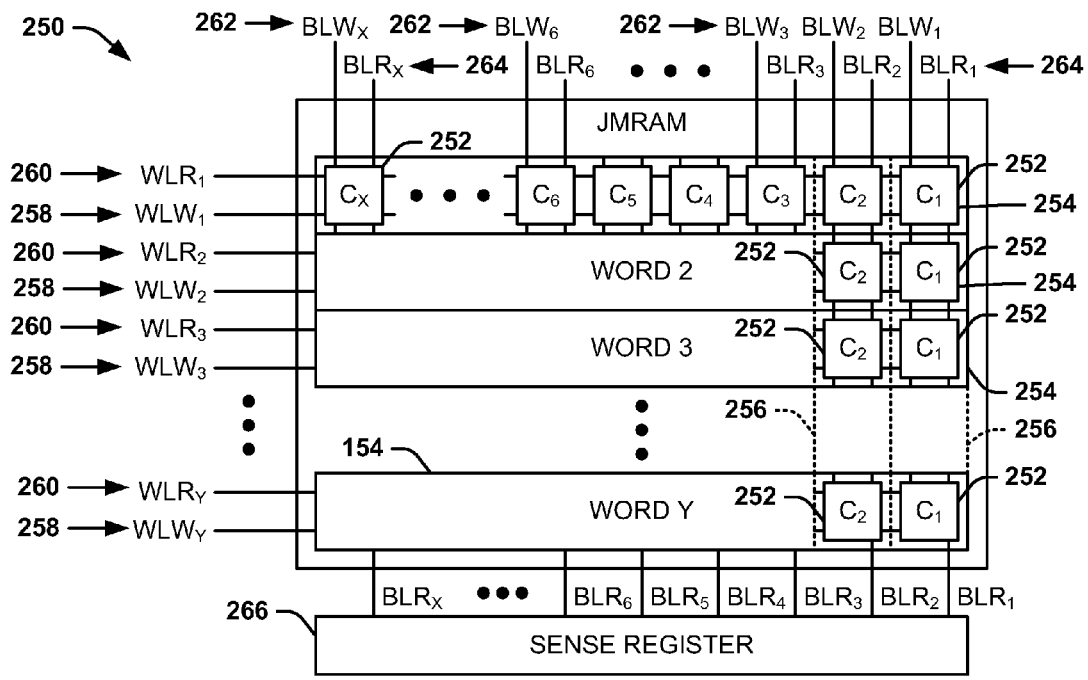
FIG. 6 illustrates an example of a Josephson magnetic random access memory (JMRAM) system.

FIG. 6 illustrates an example of a Josephson magnetic random access memory (JMRAM) system 250 in accordance with an aspect of the invention. The JMRAM system 250 can be implemented as a memory structure in a variety of computing applications.

The JMRAM system 250 is demonstrated in the example of FIG. 6 as being arranged as an array of memory cells 252. Specifically, the memory cells 252 are arranged in rows 254 that each correspond to a data word, demonstrated as WORD 1 through WORD Y, where Y is an integer greater than 1. Each of the rows 254 includes a set of memory cells 252 that form X columns 256 across the rows 254, with the memory cells 252 in WORD 1 being demonstrated in the example of FIG. 6 as $C_1$ to $C_X$, where X is an integer greater than 1. Therefore, each of the memory cells 252 in the array of the JMRAM system 250 can be individually addressable by row 254 and column 256.

In the example of FIG. 6, each of the rows 254 is demonstrated as having an associated word-write line 258 and word-read line 260, demonstrated as $WLW_1$ and $WLR_1$ through $WLW_Y$ and $WLR_Y$, respectively. The word-write line 258 and word-read line 260 can be inductively and/or magnetically coupled to each of the memory cells 252 in each of the rows 254 of the JMRAM system 250. As an example, the word-read lines 260 can be inductively coupled to an MBJJ in each of the memory cells 252 of the given one of the rows 254. In addition, each of the memory cells 252 is demonstrated as having an associated bit-write line 262 and bit-read line 264, demonstrated as $BLW_1$ and $BLR_1$ through $BLW_Y$ and $BLR_Y$, respectively. The bit-write line 262 and bit-read line 264 can be coupled to each corresponding numbered memory cell 252 in each of the rows 254 of the JMRAM system 250, such that the memory cells 252 in each column 256 are arranged in series with respect to the bit-write line 262 and bit-read line 264. Although the example of FIG. 6 describes that the word-write lines 258 and word-read lines 260 and the bit-write lines 262 and bit-read lines 264 are arranged in series with other adjacent memory cells in the respective row and column, the word-write lines 258 and word-read lines 260 and the bit-write lines 262 and bit-read lines 264 could instead be dedicated with respect to each memory cell 252.

Each of the memory cells 252 is configured to store a single bit of data. Specifically, each of the memory cells 252 can include at least one PHMJJ that can be configured to store a digital state corresponding to a binary logic-1 or a binary logic-0. The digital state can be set in response to a word-write current that is provided on the respective word-write line 258 and a bit-write current that is provided on the respective bit-write line 262. Similarly, the respective digital state that is stored in each of the memory cells 252 can be read from the memory cells 252 based on a word-read current that is provided on the respective word-read line 260 to select a given one of the rows 254 (e.g., by switching an associated MBJJ from a zero-state to a π-state) and a bit-read current that is provided on the respective bit-read line 264. Specifically, the bit-read line 264 of each of the columns 256 is coupled to a sense register 266 that is configured to measure the respective bit-read line 264 to determine whether digital state of each of the memory cells 252 of an associated row 254 correspond to a binary logic-1 state or a binary logic-0 state in response to the word-read current and the bit-read current during a data read operation. As an example, the sense register 266 can measure a voltage or a current associated with the bit-read line 264, as described in greater detail herein.

Figure 7:
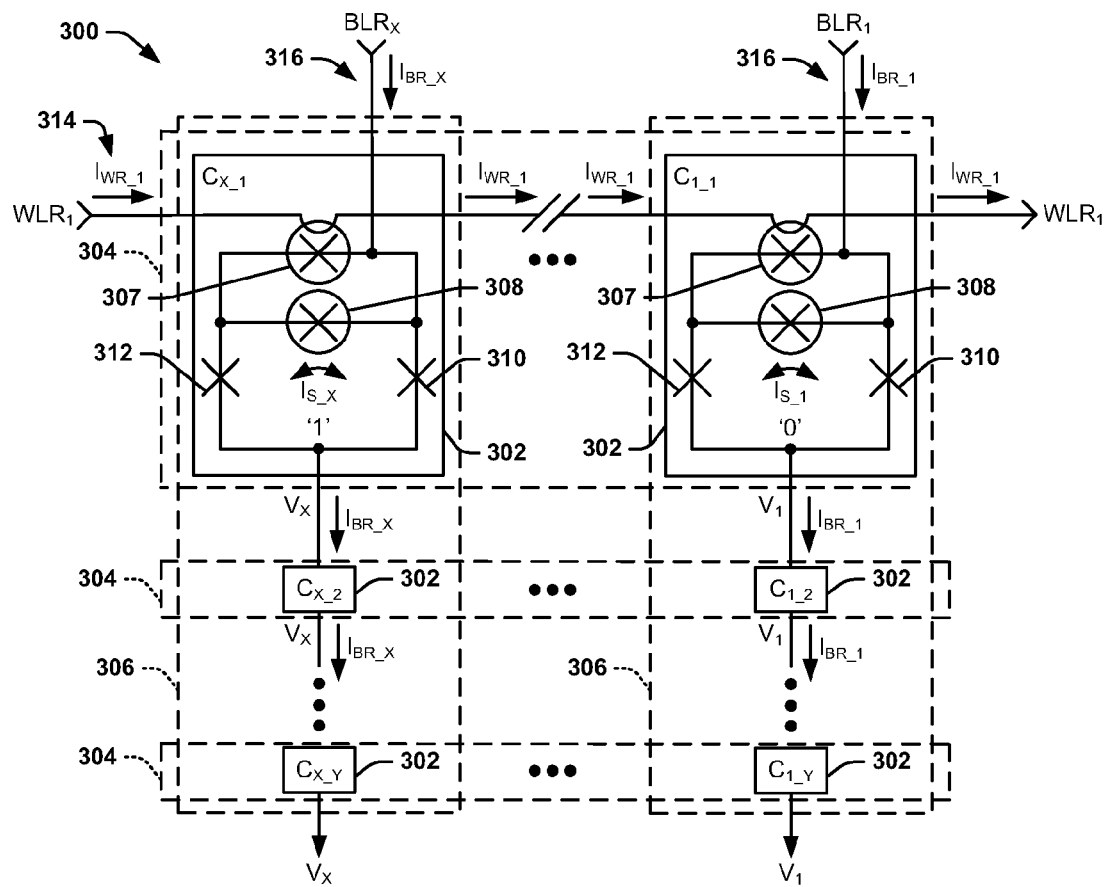
FIG. 7 illustrates another example of a JMRAM system.

FIG. 7 illustrates another example of a JMRAM system 300 in accordance with an aspect of the invention. The JMRAM system 300 can be configured similar to the JMRAM system 300 in the example of FIG. 6. Thus, reference is to be made to the example of FIG. 6 in the following description of the example of FIG. 7. Specifically, the example of FIG. 7 demonstrates a data read operation in which data is read from the JMRAM system 300.

The JMRAM system 300 is demonstrated in the example of FIG. 7 as being arranged as an array of memory cells 302. Specifically, the memory cells 302 are arranged in rows 304 that each correspond to a data WORD 1 through Y, where Y is an integer greater than 1. Each of the rows 304 includes a set of memory cells 302 that form X columns 306 across the rows 304, where X is an integer greater than 1. In the example of FIG. 7, each of the demonstrated memory cells 302 is designated by column and row, from $C_{1\_1}$ to $C_{X\_Y}$.

In the example of FIG. 7, the memory cells 302 corresponding to memory cells $C_{1\_1}$ and $C_{X\_1}$ are demonstrated in greater detail. Specifically, similar to the memory cell 50 in the example of FIG. 6, the memory cells $C_{1\_1}$ and $C_{X\_1}$ each include an MBJJ 307. The memory cells $C_{1\_1}$ and $C_{X\_1}$ also each include a PHMJJ 308 in parallel with the MBJJ 307 and a pair of Josephson junctions 310 and 312. It is to be understood that the memory cells $C_{1\_1}$ and $C_{X\_1}$ can also include word-write and bit-write lines, similar to as demonstrated in the example of FIGS. 1 and 6, but have been omitted from the example of FIG. 7 for brevity.

The JMRAM system 300 also includes a word-read line 314, demonstrated as $WLR_1$, thus corresponding to the $1^{st}$ row 304, which is inductively coupled to the MBJJ 307 of the memory cells $C_{Z\_1}$ and $C_{1\_1}$, respectively. The JMRAM system 300 also includes bit-read lines 316, demonstrated as $BLR_X$ and $BLR_1$, thus corresponding to the $X^{th}$ and $1^{st}$ columns 306, respectively. The bit-read lines 316 are demonstrated as coupled to the MBJJs 307 and the PHMJJs 308. It is to be understood that, while the example of FIG. 7 only demonstrates the word-read line $WLR_1$ and the bit-read lines $BLR_X$ and $BLR_1$, the JMRAM system 300 also includes additional word-read lines 314 for each of the rows 304 and additional bit-read lines 316 for each of the columns 306.

The word-read line $WLR_1$ conducts a DC word-read current pulse $I_{WR}$ that passes through the $1^{st}$ row 304, including the memory cells $C_{X\_1}$ and $C_{1\_1}$ which selects the $1^{st}$ row 304 for reading. As a result, the word-read current $I_{WR}$ switches the MBJJ 307 in each of the memory cells $C_{X\_1}$ and $C_{1\_1}$ from a zero-state to a π-state to provide a superconducting phase from the respective MBJJ 307. In addition, the bit-read lines $BLR_X$ and $BLR_1$ conduct bit-read currents $I_{BR\_X}$ and $I_{BR\_1}$, respectively, that pass through the $X^{th}$ and $1^{st}$ columns 306, including the memory cells $C_{X\_1}$ and $C_{1\_1}$. The collective superconducting phases of the MBJJ 307 and the PHMJJ 308 combined with the bit-read currents $I_{BR\_X}$ and $I_{BR\_1}$ through the Josephson junctions 310 and 312 are demonstrated collectively in the memory cells $C_{X\_1}$ and $C_{1\_1}$ as sense currents $I_{S\_X}$ and $I_{S\_1}$, respectively.

In the example of FIG. 7, the PHMJJ 308 that is associated with the memory cell $C_{X\_1}$ is demonstrated as storing a binary logic-1 state ('1') and the PHMJJ 308 that is associated with the memory cell $C_{1\_1}$ is demonstrated as storing a binary logic-0 state ('0'). The digital states of the memory cells $C_{X\_1}$ and $C_{1\_1}$, as well as the remaining memory cells 302 in the 1st row 304, could have been set in a previously performed data write operation. Similar to as described previously in the example of FIGS. 2 through 5, the PHMJJs 308 can provide a superconducting phase that affects the critical current of the Josephson junctions 310 and 312 depending on whether the PHMJJs 308 store a binary logic-1 state or a binary logic-0 state. Thus, by storing the binary logic-1 state, the MBJJ 307 and the PHMJJ 308 associated with the memory cell $C_{X\_1}$ can provide superconducting phases that are added to the bit-read current $I_{BR\_X}$ through the Josephson junctions 310 and 312, similar to as demonstrated in the example of FIGS. 4 and 5, such that the sense current $I_{S\_X}$ is sufficient to trigger the Josephson junction 310 and 312. However, by storing the binary logic-0 state, the PHMJJ 308 associated with the memory cell $C_{1\_1}$ can provide a zero superconducting phase, such that the superconducting phase of the MBJJ 307 and the bit-read current $I_{BR\_1}$ through the Josephson junctions 310 and 312, absent a superconducting phase of the PHMJJ 308, provides for a sense current $I_{S\_1}$ that is insufficient to trigger the Josephson junction 310 and 312, similar to as demonstrated in the example of FIGS. 2 and 3.

Based on the respective magnitudes of the sense currents $I_{S\_X}$ and $I_{S\_1}$ in response to the respective superconducting phases of the PHMJJs 308 relative to the critical currents of the Josephson junctions 310 and 312 of the memory cells $C_{X\_1}$ and $C_{1\_1}$, the Josephson junctions 310 and 312 of the memory cell $C_{X\_1}$ trigger and the Josephson junctions 310 and 312 of the memory cell $C_{1\_1}$ do not trigger. During the read operation, a sense register (not shown), such as the sense register 266 in the example of FIG. 6, can monitor a voltage $V_X$ associated with the bit-read line $BLR_X$ and a voltage $V_1$ associated with the bit-read line $BLR_1$. For example, the sense register can compare the voltages $V_X$ and $V_1$ with a threshold, such as to perform differential voltage sensing.

The Josephson junctions 310 and 312, upon triggering, can provide a voltage pulse, such that the voltage $V_X$ can have a magnitude that is greater than the voltage $V_1$. Accordingly, in the example of FIG. 7, the greater magnitude of the voltage $V_X$ and the lesser magnitude of the voltage $V_1$, such as relative to a threshold magnitude, can indicate that the memory cell $C_{X\_1}$ stores a binary logic-1 state and the memory cell $C_{1\_1}$ stores a binary logic-0 state. As another example, based on the superconductivity of the bit-read line BLR, the associated sense register can be configured to measure a magnitude of the bit-read currents $I_{BR\_X}$ and $I_{BR\_1}$ to determine the digital state of the respective memory cells $C_{X\_1}$ and $C_{1\_1}$. It is to be understood that, while the example of FIG. 7 focuses on the $X^{th}$ and $1^{st}$ columns 306, bit-read currents can be provided for all of the columns 306 therebetween, such that associated voltages on the respective bit-read lines 316 can be monitored in a similar manner. Accordingly, the entire data word associated with the $1^{St}$ row 304 can be concurrently read during the data read operation. In this manner, the memory cells 302 in any of the rows 304 can be read during the data read operation, as described in the example of FIG. 7.

Figure 8:
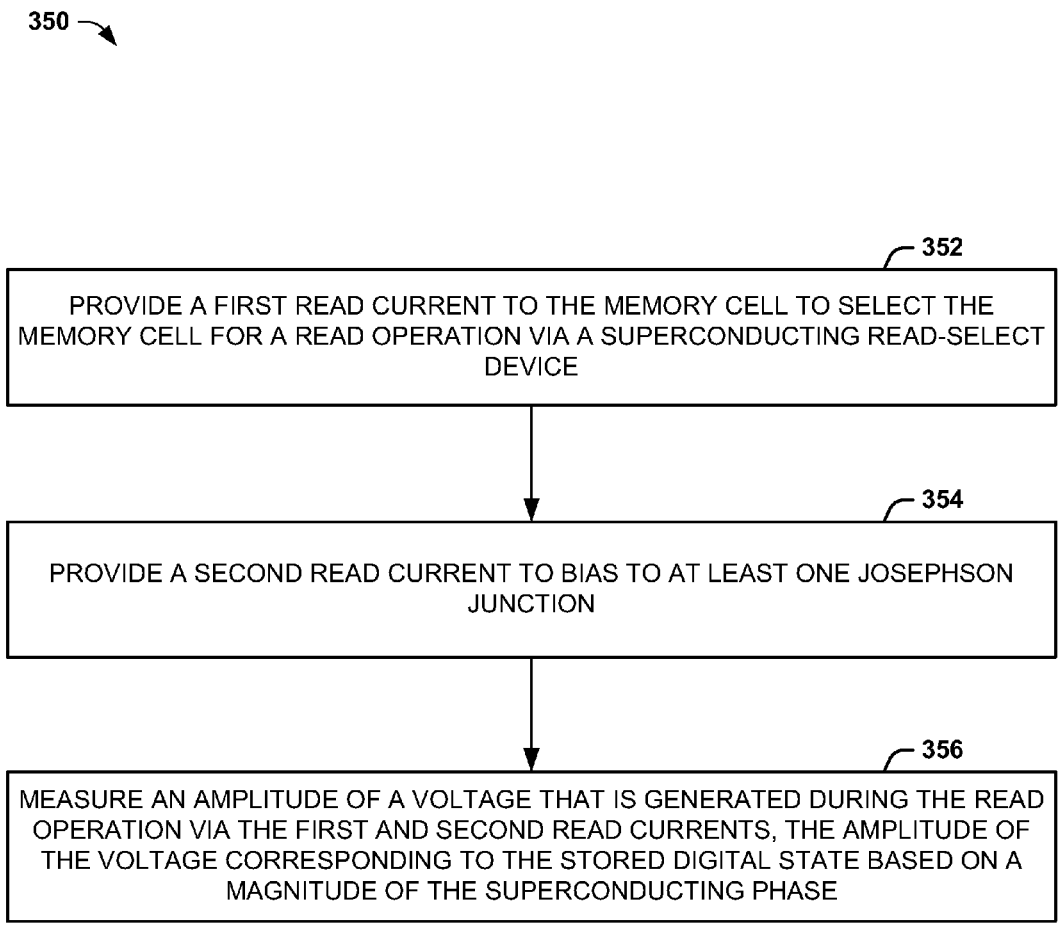
FIG. 8 illustrates an example of a method for reading a memory cell in a JMRAM system.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates an example of a method 350 for reading a memory cell (e.g., the memory cell 10) in a JMRAM system (e.g., the JMRAM system 250). At 352, a first read current (e.g., the first read current $I_{WR}$) is provided to the memory cell to select the memory cell for a read operation via a superconducting read-select device (e.g., the MBJJ 18). The memory cell can include a phase hysteretic magnetic Josephson junction (PHMJJ) (e.g., the PHMJJ 12) that is configured to store a digital state corresponding to one of a binary logic-1 state and a binary logic-0 state based on a superconducting phase (e.g., the current $I_{\pi 2}$). At 354, a second read current (e.g., the second dread current $I_{BR}$) is provided to bias to at least one Josephson junction (e.g., the Josephson junctions 14 and 16). At 356, an amplitude of a voltage (e.g., the voltages $V_1$ through $V_X$) that is generated during the read operation via the first and second read currents is measured, the amplitude of the voltage corresponding to the stored digital state based on a magnitudes of the superconducting phase.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A memory cell comprising:
   a phase hysteretic magnetic Josephson junction (PHMJJ) that is configured to store one of a first binary logic state corresponding to a binary logic-1 state and a second binary logic state corresponding to a binary logic-0 state in response to a write current that is provided to the memory cell and to generate a superconducting phase based on the stored digital state;
   a superconducting read-select device that is configured to implement a read operation in response to a read current that is provided to the memory cell; and
   at least one Josephson junction configured to provide an output based on the superconducting phase of the PHMJJ during the read operation, the output corresponding to the stored digital state.

2. The memory cell of claim 1, wherein the superconducting phase is a first superconducting phase, wherein the superconducting read-select device is configured as a magnetic-barrier Josephson junction (MBJJ) configured to provide a second superconducting phase in response to the read current to trigger the at least one Josephson junction.

3. The memory cell of claim 2, wherein the MBJJ and the PHMJJ are arranged in parallel with respect to each other in the memory cell, and wherein the at least one Josephson junction comprises a pair of Josephson junctions that are arranged in series with respect to the MBJJ and the PHMJJ to form a Superconducting Quantum Interference Device (SQUID).

4. The memory cell of claim 2, wherein the read current comprises a first read current and a second read current that are both provided to the memory cell during a read operation, wherein the first read current is provided to a node interconnecting the MBJJ and the PHMJJ to bias the at least one Josephson junction and the second read current is inductively coupled to the MBJJ to switch the MBJJ from a zero-state to a π-state to provide the second superconducting phase.

5. The memory cell of claim 1, wherein the PHMJJ is configured to generate the superconducting phase in response to storing one of the first and second binary logic states, wherein the PHMJJ is configured to trigger the at least one Josephson junction during the read operation based on the superconducting phase, the read current, and the superconducting read-select device to provide a voltage having a first magnitude at an output of the memory cell, the first magnitude of the voltage being indicative of the one of the first and second binary logic states.

6. The memory cell of claim 5, wherein the PHMJJ is configured to generate a zero superconducting phase in response to storing the other of the first and second binary logic states, wherein the PHMJJ is configured to not trigger the at least one Josephson junction during the read operation based on the zero superconducting phase, such that a voltage having a second magnitude is provided at the output, the second magnitude of the voltage being indicative of the other of the first and second binary logic states.

7. A Josephson magnetic random access memory (JM-RAM) system comprising an array of memory cells comprising the memory cell of claim 1, the array of memory cells being arranged in rows and columns, wherein the write current is a word-write current that is provided on a word-write line associated with a row of the array of memory cells, wherein a second write current is provided on a bit-write line of the array of memory cells as a bit-write current, wherein the read current is a word-read current that is provided on a word-read line associated with the row of the array of memory cells, and wherein a second read current is provided on a bit-read line as a bit-read current.

8. The JMRAM of claim 7, wherein the word-write line and the word-read line are common to each of the memory cells in a given row of the array, and wherein the bit-write line and the bit-read line are common to each of the memory cells in a given column of the array, such that the array of memory cells are arranged in series with respect to each of the rows and each of the columns of the array.

9. The JMRAM of claim 7, wherein each of the word-write line and the bit-write line associated with a given memory cell are magnetically coupled to the PHMJJ, wherein the word-write current is provided on the word-write line through each of the memory cells in a given one of the rows during a data write operation, and wherein the bit-write line comprises a plurality of bit-write lines that are each associated with a respective one of the columns, each of a respective plurality of bit-write currents being associated with storage of one of the binary logic-1 state and the binary logic-0 state in each of the memory cells in the given one of the rows.

10. The JMRAM of claim 7, wherein the word-read line comprises a plurality of word-read lines that are each associated with a respective one of the rows, each of the plurality of word-read lines being inductively coupled to the superconducting read-select device associated with each of the respective memory cells in a given one of the rows, wherein the bit-read line comprises a plurality of bit-read lines that are each associated with a respective one of the columns and are provided to bias the at least one Josephson junction associated with each of the respective memory cells in a given one of the rows that is selected in response to the word-read current during the read operation to provide an indication of the stored digital state of each of the PHMJJs in the given one of the rows on the plurality of bit-read lines.

11. A method for reading a memory cell in a Josephson magnetic random access memory (JMRAM) system, the method comprising:

providing a first read current to the memory cell to select the memory cell for a read operation via a superconducting read-select device, the memory cell comprising a phase hysteretic magnetic Josephson junction (PHMJJ) that is configured to store a digital state corresponding to one of a binary logic-1 state and a binary logic-0 state based on a superconducting phase;

providing a second read current to bias at least one Josephson junction; and measuring an amplitude of a voltage that is generated during the read operation via the first and second read currents, the amplitude of the voltage corresponding to the stored digital state based on a magnitude of the superconducting phase.

12. The method of claim 11, wherein the at least one Josephson junction comprises a pair of Josephson junctions arranged in series with respect to the superconducting read-select device and the PHMJJ to form a Superconducting Quantum Interference Device (SQUID), wherein measuring the amplitude of the voltage comprises measuring the amplitude of the voltage that is generated based on whether the pair of Josephson junctions triggers based on the magnitude of the superconducting phase.

13. The method of claim 11, wherein the superconducting read-select device is a magnetic-barrier Josephson junction (MBJJ), wherein providing the first read current comprises providing the first read current to the MBJJ to switch the MBJJ from a zero-state to a $\pi$-state during the read operation.

14. The method of claim 13, wherein providing the first read current comprises providing the first read current to a node interconnecting the MBJJ and the PHMJJ, and wherein providing the second read current comprises inductively coupling the second read current to the MBJJ.

15. The method of claim 11, wherein providing the second read current comprises providing the second read current as a bit-read current to the memory cell and to each of a column of additional memory cells in an array of memory cells, and wherein providing the first read current comprises providing the first read current as a word-read current to the memory cell and to each of a row of additional memory cells in the array of memory cells, wherein measuring an amplitude comprises measuring an amplitude of a plurality of voltages associated with the memory cell and each of the row of additional memory cells based on the word-read current and a respective plurality of bit-read currents.

16. A Josephson magnetic random access memory (JM-RAM) system comprising:

a plurality of word-write lines each configured to conduct a respective word-write current that selects a given row of memory cells during a data write operation, the memory cells each comprising a magnetic-barrier Josephson junction (MBJJ), a phase hysteretic magnetic Josephson junction (PHMJJ), and at least one Josephson junction;

a plurality of bit-write lines each configured to conduct a respective bit-write current to write a digital state corresponding to one of a binary logic-0 state and a binary logic-1 state into the PHMJJ associated with each memory cell of the given row of memory cells, the PHMJJ being magnetically coupled to a respective one of the plurality of word-write lines and a respective one of the plurality of bit-write lines;

a plurality of word-read lines each configured to conduct a respective word-read current that is provided to the MBJJ of each of the memory cells in the given row to select the given row of memory cells during a read operation; and a plurality of bit-read lines each configured to conduct a respective bit-read current to bias the at least one Josephson junction of each of the memory cells in a given column, the MBJJ in a respective memory cell switching from a zero-state to a π-state in response to the word-read current to provide an indication of the stored digital state during the read operation via the biased at least one Josephson junction in response to the π-state and a superconducting phase provided by the PHMJJ.

17. The system of claim 16, wherein the respective memory cell is configured to provide the indication of the stored digital state during the read operation via the at least one Josephson junction in response to the π-state and a magnitude of the superconducting phase provided by the PHMJJ, the superconducting phase having one of a first magnitude corresponding to the binary logic-0 state and a second magnitude corresponding to the binary logic-1 state.

18. The system of claim 16, wherein the respective memory cell is configured to provide the indication of the stored digital state during the read operation based on a voltage having a first amplitude corresponding to the binary logic-0 state and a second amplitude corresponding to the binary logic-1 state based on the superconducting phase.

19. The system of claim 16, wherein the respective bit-read current is provided to a node interconnecting the MBJJ and the PHMJJ of the respective memory cell, and wherein the respective word-read current is inductively coupled to the MBJJ of the respective memory cell.

20. The system of claim 18, wherein the MBJJ and the PHMJJ are arranged in parallel with respect to each other in the respective memory cell, and wherein the at least one Josephson junction comprises a pair of Josephson junctions that are arranged in series with respect to the MBJJ and the PHMJJ to form a Superconducting Quantum Interference Device (SQUID).

* * * * *